US007956671B2

(12) United States Patent
Abou-Khalil et al.

(10) Patent No.: US 7,956,671 B2
(45) Date of Patent: Jun. 7, 2011

(54) CIRCUIT STRUCTURE AND METHOD FOR PROGRAMMING AND RE-PROGRAMMING A LOW POWER, MULTIPLE STATES, ELECTRONIC FUSE (E-FUSE)

(75) Inventors: Michel J. Abou-Khalil, Essex Junction, VT (US); Tom C. Lee, Essex Junction, VT (US); Junjun Li, Williston, VT (US); Robert J. Gauthier, Jr., Hinesburg, VT (US); Christopher S. Putnam, Hinesburg, VT (US); Souvick Mitra, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/496,002

(22) Filed: Jul. 1, 2009

(65) Prior Publication Data

US 2011/0001551 A1  Jan. 6, 2011

(51) Int. Cl.
*H01L 23/52*  (2006.01)
(52) U.S. Cl. .................. 327/525; 327/565; 326/47
(58) Field of Classification Search .................. None
See application file for complete search history.

(56) References Cited

U.S. PATENT DOCUMENTS

| | | | |
|---|---|---|---|
| 5,412,593 A | 5/1995 | Magel et al. | |
| 5,937,515 A | 8/1999 | Johnson | |
| 5,966,339 A | 10/1999 | Hsu et al. | |
| 6,100,746 A | 8/2000 | Wu | |
| 6,285,238 B1 | 9/2001 | Wu | |
| 6,609,070 B1 | 8/2003 | Lueck | |
| 7,298,639 B2 | 11/2007 | Hsu et al. | |
| 7,388,273 B2 * | 6/2008 | Burr et al. | 257/529 |
| 7,394,089 B2 | 7/2008 | Doyle et al. | |
| 7,459,763 B1 * | 12/2008 | Issaq et al. | 257/530 |
| 2006/0249808 A1 | 11/2006 | Hsu et al. | |
| 2007/0262413 A1 | 11/2007 | Booth, Jr. et al. | |
| 2008/0197339 A1 | 8/2008 | Regan et al. | |
| 2008/0217733 A1 | 9/2008 | Iyer et al. | |
| 2009/0045484 A1 * | 2/2009 | Chanda et al. | 257/529 |

OTHER PUBLICATIONS

PCT/US2010038934, International Search Report and Written Opinion, Jan. 18, 2011, 9 pages.

* cited by examiner

*Primary Examiner* — Lincoln Donovan
*Assistant Examiner* — Terry L Englund
(74) *Attorney, Agent, or Firm* — Gibb I.P. Law Firm, LLC; Michael J. LeStrange, Esq.

(57) ABSTRACT

In one embodiment of an e-fuse programming/re-programming circuit, the e-fuse has two short high atomic diffusion resistance conductor layers positioned on opposite sides and at a same end of a long low atomic diffusion resistance conductor layer. A voltage source is used to vary the polarity and, optionally, the magnitude of voltage applied to the terminals in order to control bi-directional flow of electrons within the long conductor layer and, thereby formation of opens and/or shorts at the long conductor layer-short conductor layer interfaces. The formation of such opens and/or shorts can be used to achieve different programming states. Other circuit structure embodiments incorporate e-fuses with additional conductor layers and additional terminals so as to allow for even more programming states. Also disclosed are embodiments of associated e-fuse programming and re-programming methods.

20 Claims, 8 Drawing Sheets

Initial State 11

CIRCUIT STRUCTURE AND METHOD FOR PROGRAMMING AND RE-PROGRAMMING A LOW POWER, MULTIPLE STATES, ELECTRONIC FUSE (E-FUSE)

BACKGROUND

1. Field of the Invention

The embodiments of the invention generally relate to electronic fuses (e-fuses) and, more specifically, to embodiments of a circuit structure for programming and re-programming a low power, multiple states, e-fuse and an associated method for programming and re-programming such an e-fuse.

2. Description of the Related Art

Programmable fuses or anti-fuses, e.g., electrical or laser fuses or anti-fuses, are critical for modem integrated circuit applications to achieve redundant, reusable and reliable design. Unfortunately, most such programmable fuses or anti-fuses can be programmed only once. That is, they are destructive in nature so that re-programming is impossible. For example, when a conventional electronic fuse is programmed (i.e., blown), an open state is created that can not be reversed. Similarly, when a conventional anti-fuse is programmed, a short state is created that can not be reversed. Non-volatile random access memory (NVRAM) uses a floating gate scheme that is capable of reprogramming many times and can be incorporated into circuit designs for programming functions in place of programmable fuses. However, the use of NVRAM technology significantly increases process complexity and manufacturing costs. Therefore, it would be advantageous to provide a low power, multiple states e-fuse that can be more easily incorporated into existing processes and where the programming is non-destructive in nature, along with a circuit structure for performing the programming and re-programming, and an associated method for programming and re-programming such an e-fuse.

SUMMARY

In view of the foregoing, disclosed herein are embodiments a circuit structure for programming and re-programming a low power, multiple states, electronic fuse (i.e., an e-fuse). In one embodiment of the circuit, the e-fuse can comprise two relatively short conductor layers positioned on opposite sides and at a same end of a relatively long conductor layer. The short conductor layers can have a relatively high atomic diffusion resistance (i.e., can exhibit low atomic diffusivity) and the long conductor layer can have a relatively low atomic diffusion resistance (i.e., can exhibit high atomic diffusivity). A voltage source can be electrically connected to opposing ends of the long conductor layer and also to each of the short conductor layers such that the e-fuse structure has four terminals. The voltage source can be selectively controlled in order to vary the polarity and, optionally, the magnitude of the voltage applied to the different terminals. By varying voltage polarity (and magnitude) at the different terminals, bi-directional flow of electrons within the long conductor layer can be selectively controlled. By controlling bi-directional flow of electrons within the long conductor layer, formation of non-destructive opens and/or shorts at the long conductor layer-short conductor layer interfaces can be selectively controlled to achieve multiple different programming states. Other embodiments of the circuit incorporate an e-fuse with additional conductor layers and additional terminals so as to allow for even more programming states. Also disclosed are embodiments of associated e-fuse programming and re-programming methods.

More particularly, disclosed herein are embodiments of a circuit structure for programming and re-programming a low power, multiple states, electronic fuse (i.e., an e-fuse).

In one embodiment, the circuit structure can comprise an e-fuse. The e-fuse can comprise a first conductor layer, a second conductor layer on the first conductor layer, and a third conductor layer on the second conductor layer. The first conductor layer and the third conductor layer can each have a relatively high atomic diffusion resistance as compared to the second conductor layer. The circuit structure can further comprise a voltage source and electrical connections between the voltage source and various locations on the e-fuse to create terminals. Specifically, an electrical connection between the voltage source and the first conductor layer can create a first terminal. An electrical connection between the voltage source and the third conductor layer can create a second terminal. Finally, electrical connections between the voltage source and opposite ends of the second conductor layer can create third and fourth terminals, respectively. Thus, in this embodiment, the e-fuse can have four distinct terminals. The voltage source is selectively controllable so as to allow the polarity of the voltage and, optionally, the magnitude of the voltage at the electrical connections (i.e., at the four terminals) to be varied in order to selectively control bi-directional flow of electrons within the second conductor layer. By selectively controlling bi-directional flow of electrons within the second conductor layer, the formation of non-destructive opens and/or shorts within the second conductor layer at the high atomic diffusion resistance-low atomic diffusion resistance interfaces (i.e., at the interfaces between the second conductor layer and the first and third conductor layers) can be selectively controlled. By selectively controlling formation of such opens and/or shorts, the e-fuse can be programmed and re-programmed with any one of four different programming states.

In another embodiment, the circuit structure can also comprise an e-fuse. In this embodiment the e-fuse can comprise additional conductive layers allowing for more high atomic diffusion resistance-low atomic diffusion resistance interfaces, more terminals and, thereby more programming states. Specifically, the e-fuse can comprise a first conductor layer, a second conductor layer above the first conductor layer, a third conductor layer above the second conductor layer, and a fourth conductor layer above the third conductor layer. The second conductor layer and the fourth conductor layer can each have a relatively high atomic diffusion resistance as compared to the first conductor layer and the third conductor layer. This circuit structure can further comprise a voltage source and electrical connections between the voltage source and opposite ends of the first conductor layer, between the voltage source and opposite ends of the third conductor layer, and between the voltage source and the fourth conductor layer. Thus, in this embodiment, the e-fuse can have five distinct terminals. The voltage source can be selectively controllable so as to allow the polarity of the voltage and, optionally, the magnitude of the voltage at the electrical connections (i.e., at the five terminals) to be varied in order to selectively control bi-directional flow of electrons within the first and third conductor layers. By selectively controlling bi-directional flow of electrons within the first and third conductor layers, the formation of non-destructive opens and/or shorts within the first and third conductor layers at the high atomic diffusion resistance-low atomic diffusion resistance interfaces (i.e., within the first conductor layer at the interface with the second conductor layer and within the third conductor layer at the interfaces with the second conductor layer and the fourth conductor layer can be selectively controlled) can be selectively controlled. As with the previous embodiment, by selectively controlling formation of such opens and/or shorts, the e-fuse can be programmed and re-programmed with any one of multiple different states.

Also disclosed herein are embodiments of an associated e-fuse programming and re-programming method. Embodiments of the method can comprise providing an e-fuse, electrically connecting a voltage source to different locations on the e-fuse and performing e-fuse programming and re-programming processes by selectively controlling the voltage source so as to selectively vary the polarity and, optionally, the magnitude of the voltage at the different locations.

In one embodiment, the method can comprise providing an e-fuse comprising a first conductor layer, a second conductor layer on the first conductor layer, and a third conductor layer on the second conductor layer. The first conductor layer and the third conductor layer can each have a relatively high atomic diffusion resistance as compared to the second conductor layer. Electrical connections are them formed between a voltage source and the first conductor layer creating a first terminal, between the voltage source and the third conductor layer creating a second terminal and between the voltage source and opposite ends of the second conductor layer creating third and fourth terminals, respectively. Next, e-fuse programming and reprogramming processes can be performed by selectively controlling the voltage source so as to allow voltage polarity at the electrical connections (i.e., at the four terminals) to be varied in order to selectively control bi-directional flow of electrons within the second conductor layer. The bi-directional flow of electrons within the second conductor layer can be selectively controlled in order to selectively form non-destructive opens and/or shorts within the second conductor layer at the high atomic diffusion resistance-low atomic diffusion resistance interfaces (i.e., at the interfaces between the second conductor layer and the first and third conductor layers) and, thereby to program or re-program the e-fuse with any one of four different programming states.

In another embodiment, the method can comprise providing an e-fuse having additional conductive layers allowing for more high atomic diffusion resistance-low atomic diffusion resistance interfaces, more terminals and, thereby more programming states. More specifically, this method embodiment can comprise providing an e-fuse comprising a first conductor layer, a second conductor layer above the first conductor layer, a third conductor layer above the second conductor layer, and a fourth conductor layer above the third conductor layer. The second conductor layer and the fourth conductor layer can each have a relatively high atomic diffusion resistance as compared to the first conductor layer and the third conductor layer. Electrical connections are formed between a voltage source and opposite ends of the first conductor layer (i.e., proximate and distal ends of the first conductor layer), between the voltage source and opposite ends of the third conductor layer (i.e., proximate and distal ends of the third conductor layer), and between the voltage source and the fourth conductor layer. Thus, in this embodiment five distinct terminals are created. Next, e-fuse programming and reprogramming processes can be performed by selectively controlling the voltage source so as to allow voltage polarity at the electrical connections (i.e., at the five terminals) to be varied in order to selectively control bi-directional flow of electrons within the first and third conductor layers. The bi-directional flow of electrons within the first and third conductor layers can be selectively controlled in order to form non-destructive opens and/or shorts within the first and third conductor layers at the high atomic diffusion resistance-low atomic diffusion resistance interfaces (i.e., within the first conductor layer at the interface with the second conductor layer and within the third conductor layer at the interfaces with the second conductor layer and the fourth conductor layer can be selectively controlled). As with the previous method embodiment, by selectively controlling formation of such opens and/or shorts, the e-fuse can be programmed and re-programmed with any one of multiple different states.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

In view of the foregoing, disclosed herein are embodiments a circuit structure for programming and re-programming a low power, multiple states, electronic fuse (i.e., an e-fuse). In one embodiment of the circuit, the e-fuse can comprise two relatively short conductor layers positioned on opposite sides and at a same end of a relatively long conductor layer. The short conductor layers can have a relatively high atomic diffusion resistance (i.e., can exhibit low atomic diffusivity) and the long conductor layer can have a relatively low atomic diffusion resistance (i.e., can exhibit high atomic diffusivity). A voltage source can be electrically connected to opposing ends of the long conductor layer and also to each of the short conductor layers such that the e-fuse structure has four terminals. The voltage source can be selectively controlled in order to vary the polarity and, optionally, the magnitude of the voltage applied to the different terminals. By varying voltage polarity (and magnitude) at the different terminals, bi-directional flow of electrons within the long conductor layer can be selectively controlled. By controlling bi-directional flow of electrons within the long conductor layer, formation of non-destructive opens and/or shorts at the long conductor layer-short conductor layer interfaces can be selectively controlled to achieve multiple different programming states. Other embodiments of the circuit incorporate an e-fuse with additional conductor layers and additional terminals so as to allow for even more programming states. Also disclosed are embodiments of associated e-fuse programming and re-programming methods.

More particularly, disclosed herein are embodiments of a circuit structure for programming and re-programming a low power, multiple states, electronic fuse (i.e., an e-fuse).

Figure 1:
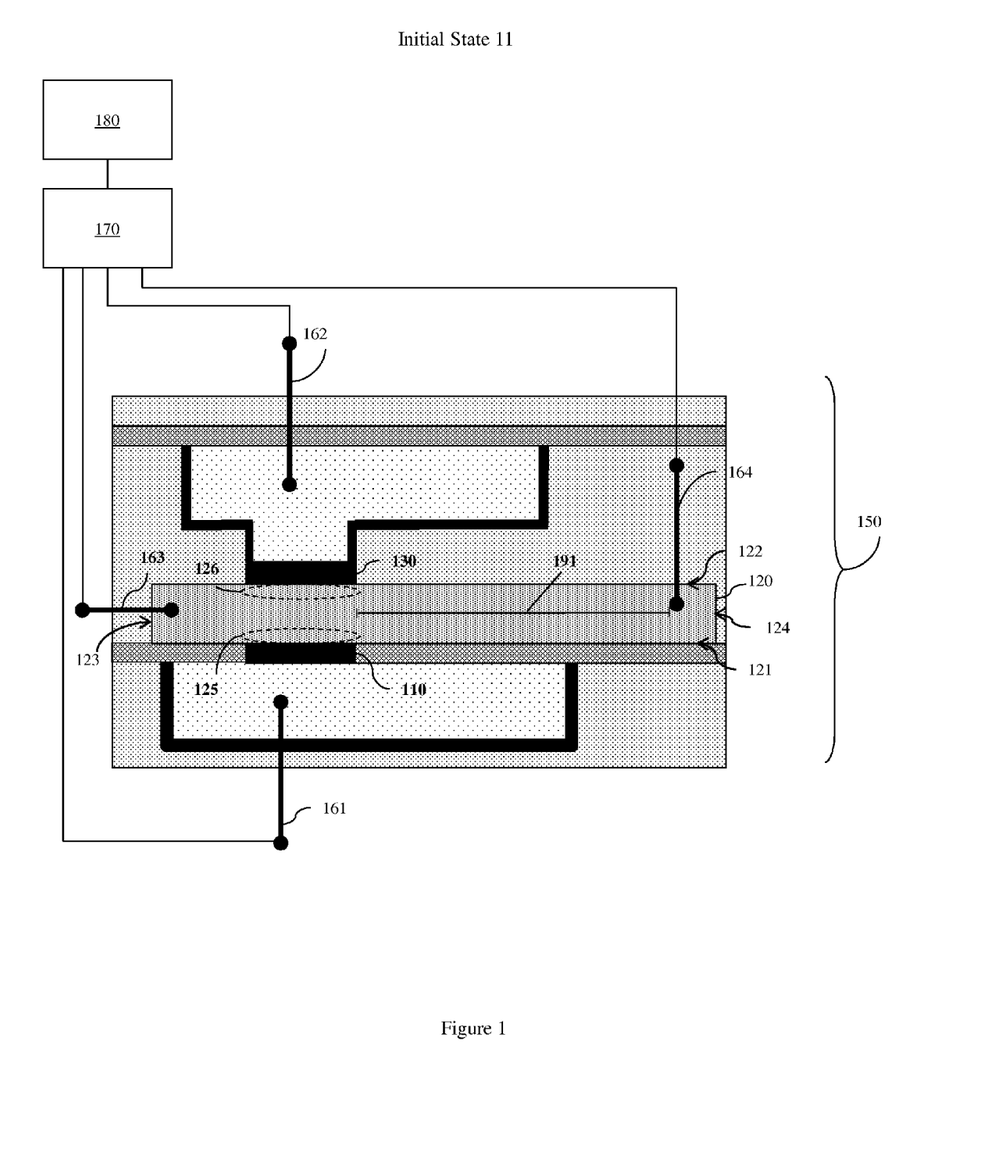
FIG. 1 is a schematic diagram of an embodiment of an e-fuse programming and re-programming circuit illustrating an e-fuse in a 11 programming state.

Referring to FIG. 1, one embodiment of the circuit structure can comprise an e-fuse 150, a selectively controllable voltage source 170 and electrical connections 161-164 between the e-fuse 150 and the voltage source 170.

The e-fuse 150 can comprise a first conductor layer 110, a second conductor layer 120 on the first conductor layer 110, and a third conductor layer 130 on the second conductor layer 120. The first conductor layer 110 and the third conductor layer 130 can be short relative to the second conductor layer 120 and can further be positioned on opposite sides 121, 122 of (i.e., above and below) and adjacent to one end 123 (i.e., a proximate end) of the second conductor layer 120. Additionally, in this embodiment, the first conductor layer 110 and the third conductor layer 130 each have a relatively high atomic diffusion resistance as compared to the second conductor layer 120. Specifically, the second conductor layer 120 can comprise any suitable conductive material that exhibits low atomic diffusion resistance (i.e., exhibits high atomic diffusivity). For example, the second conductor layer 120 can comprise copper or aluminum. Contrarily, the first and third conductor layers 110, 130 can comprise any suitable conductive material that exhibits high atomic diffusion resistance (i.e., a conductive diffusion barrier material that exhibits low atomic diffusivity). For example, the first and third conductor layers can comprise cobalt, chromium, ruthenium, tantalum, tantalum nitride, indium oxide, tungsten, tungsten nitride, titanium and titanium nitride or any suitable allow thereof. It should be noted that the first and third conductor layers 110, 130 can comprise either the same conductive diffusion barrier materials or different conductive diffusion barrier materials.

The electrical connections 161-164 between the voltage source 170 and various locations on the e-fuse 150 create terminals. Specifically, an electrical connection 161 between the voltage source 170 and the first conductor layer 110 creates a first terminal. An electrical connection 162 between the voltage source 170 and the third conductor layer 130 creates a second terminal. Finally, electrical connections 163, 164 between the voltage source 170 and opposite ends (i.e., a proximate end 123 and a distal end 124) of the second conductor layer 120 create third and fourth terminals, respectively. Thus, in this embodiment, the e-fuse 150 has four distinct terminals.

The voltage source 170 is selectively controllable (i.e., is adapted to be selectively controlled, configured to be selectively controlled, for example, by a control signal from controller 180) so as to allow the polarity of the voltage and, optionally, the magnitude of the voltage at the electrical connections 161-164 (i.e., at the four terminals) to be varied. That is, the voltage source 170 can comprise a conventional voltage polarity switching circuit. Those skilled in the art will recognize that voltage polarity switching circuits are well-known; therefore, the specific details of such switching circuits are omitted to allow the reader to focus on the salient aspects of the embodiments described herein.

Figure 2:
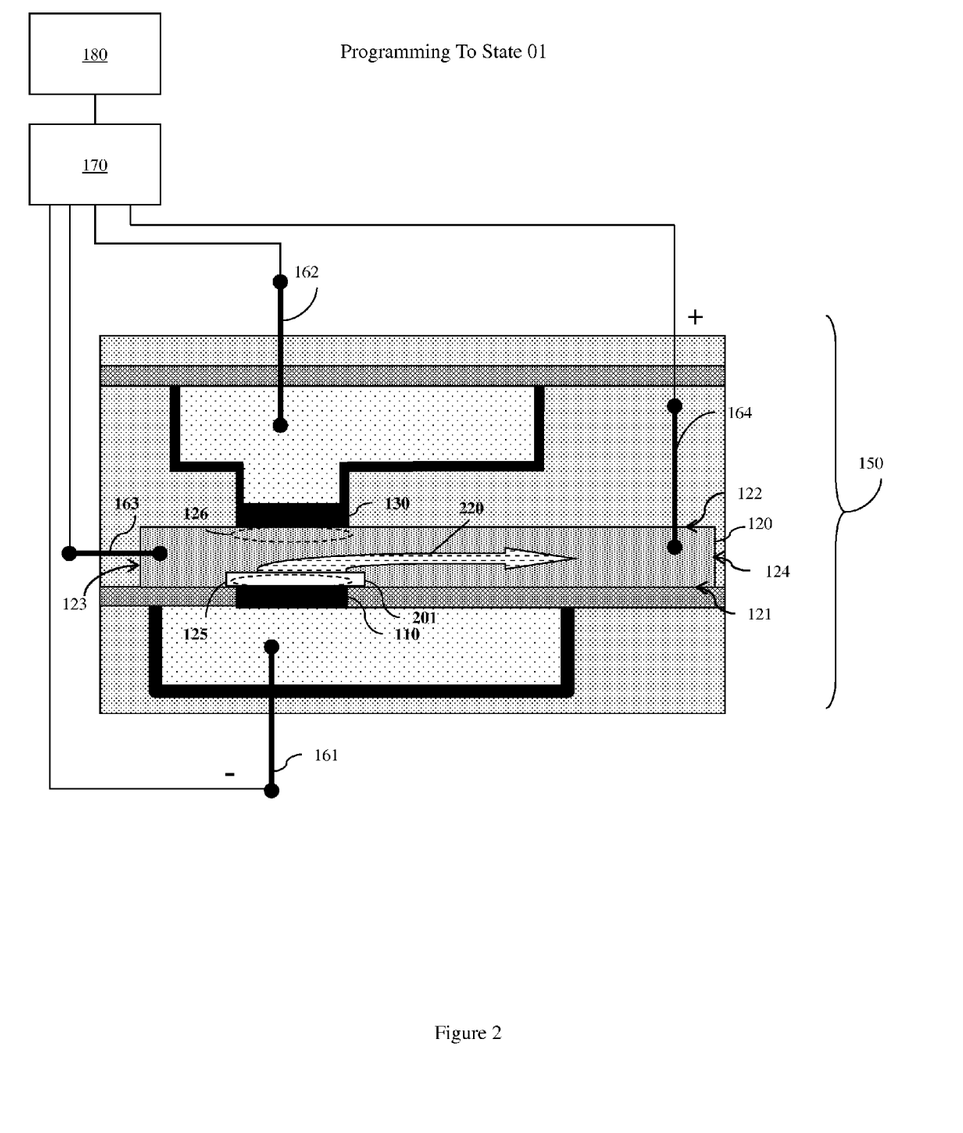
FIG. 2 is a schematic diagram of the embodiment of the e-fuse programming and re-programming circuit of FIG. 1 illustrating the e-fuse in a 01 programming state.
Figure 4:
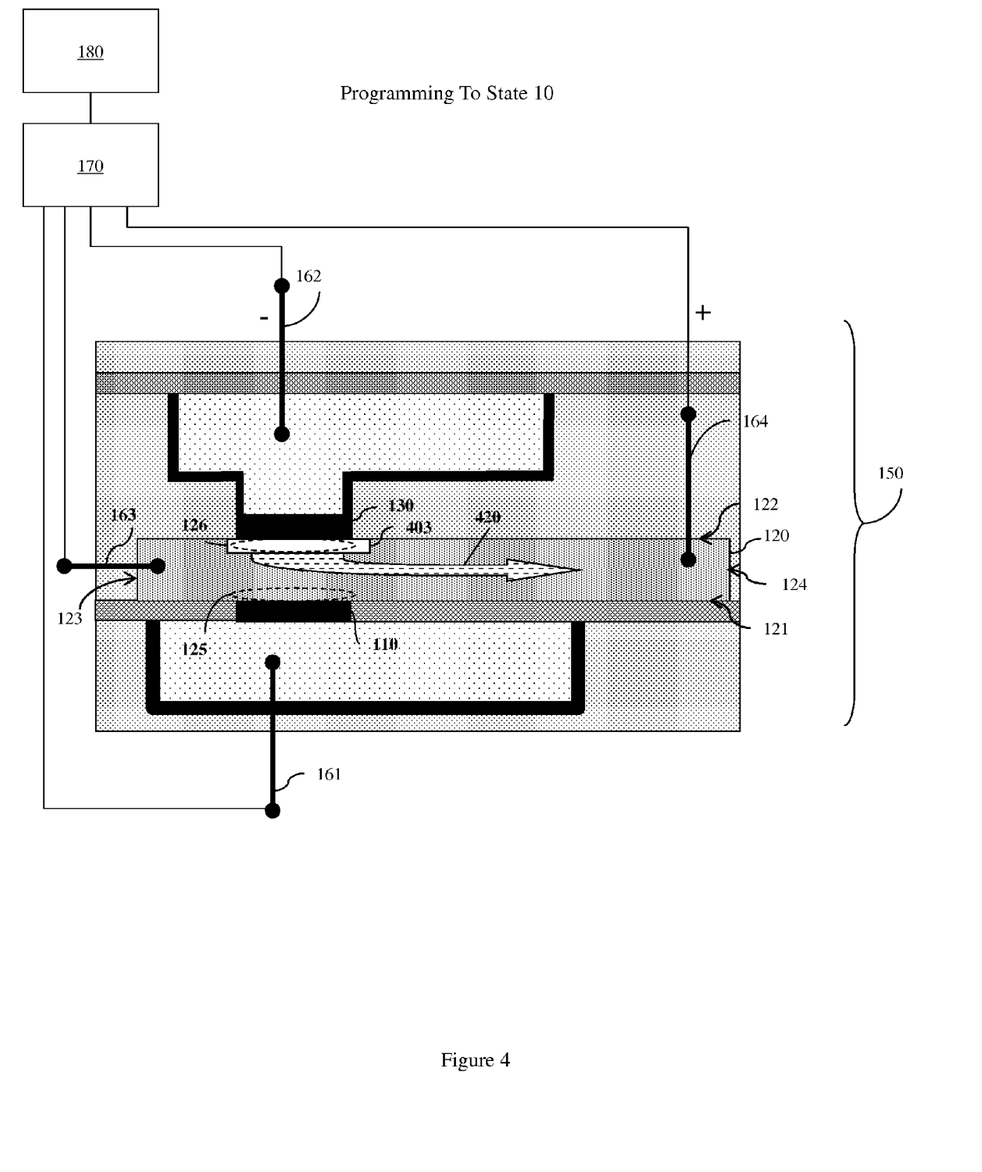
FIG. 4 is a schematic diagram of the embodiment of the e-fuse programming and re-programming circuit of FIG. 1 illustrating the e-fuse in a 10 programming state.
Figure 5:
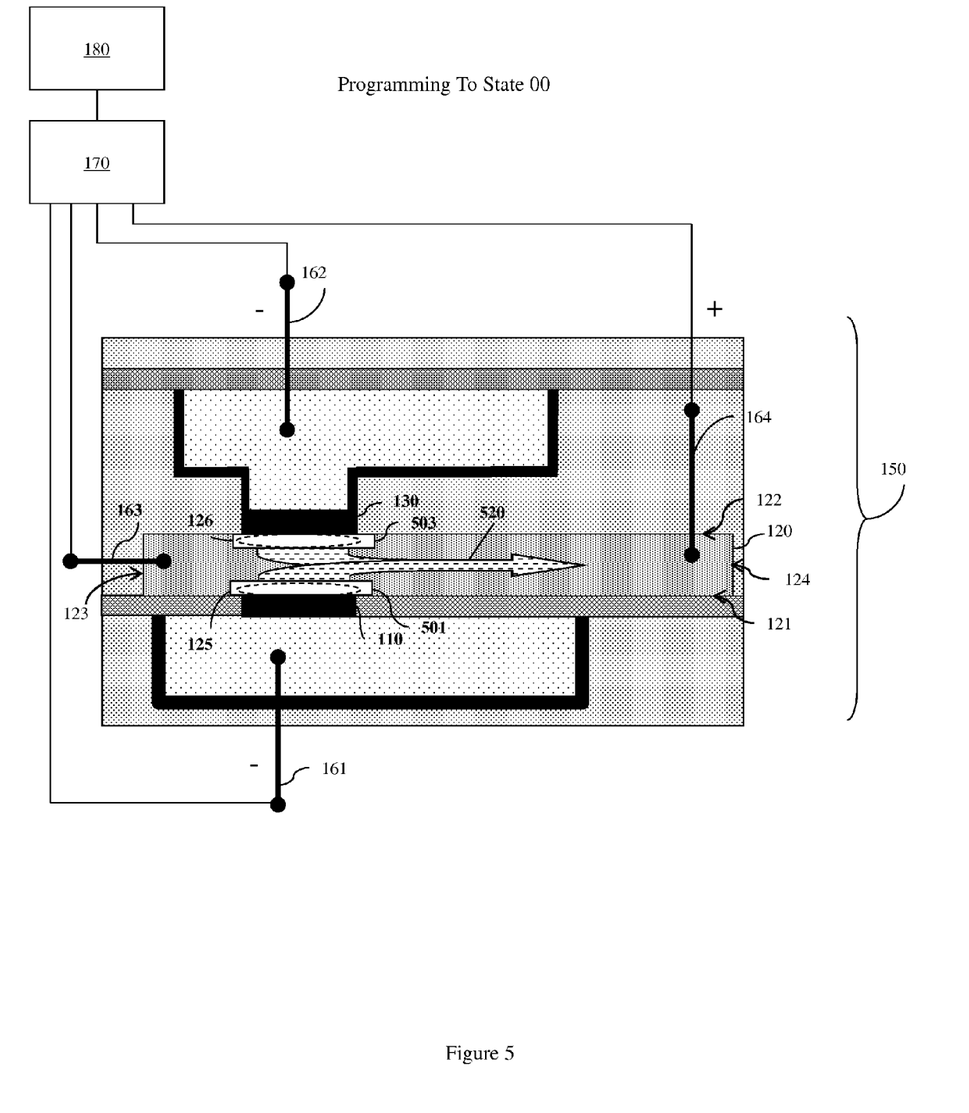
FIG. 5 is a schematic diagram of the embodiment of the e-fuse programming and re-programming circuit of FIG. 1 illustrating the e-fuse in a 00 programming state.

By selectively varying voltage polarity and, optionally, magnitude at the terminals 161-163, bi-directional flow of electrons within the second conductor layer 120 can be selectively controlled. By selectively controlling bi-directional flow of electrons within the second conductor layer 120, the formation of non-destructive opens and/or shorts within the second conductor layer at the high atomic diffusion resistance-low atomic diffusion resistance interfaces 125, 126 (i.e., at the interfaces 125-126 between the second conductor layer 120 and the first and third conductor layers 110, 130) can be selectively controlled. By selectively controlling formation of such opens and/or shorts, the e-fuse 150 can be programmed and re-programmed with any one of four different programming states. These states are referred to hereinafter as: 11, 01, 10, and 00, with state 11, as shown in FIG. 1, comprising an initial state (i.e., a baseline state) without any opens such that all terminals 161-164 are electrically connected (i.e., such that there are shorts at the interfaces 125-126 between the second conductor layer 120 and both the first conductor layer 110 and the third conductor layer 130) and with states 01, 10, and 00, as shown in FIGS. 2, 4 and 5, respectively, comprising programmed states with one or more opens at the interfaces 125-126 between the second conductor layer 120 and the first and third conductor layers 110, 130.

For example, the e-fuse 150 can be programmed from the initial 11 state to a 01 state and re-programmed back to the 11 state on demand. Specifically, referring to FIG. 2, a control signal can cause the voltage source 170 to apply a negative voltage to the first conductor layer 110 (i.e., to the first terminal 161) and a positive voltage to the distal end 124 of the second conductor layer 120 (i.e., to the fourth terminal 164). This will cause electrons within the second conductor layer to flow 220 from the interface 125 between the first conductor layer 110 and the second conductor layer 120 towards the distal end 124 of the second conductor layer 120 (i.e., towards the fourth terminal 164). Electrons flowing in this direction will cause atomic diffusion of the second conductor material (i.e., the conductive material that makes up the second conductor layer 120) away from the interface 125, thus creating an open 201 (i.e., a void). This open 201 effectively disconnects the terminal 161 from the other terminals 162-164. Electrons do not flow across the interface 126. Consequently, the second conductor material remains at the interface 126 between the third conductor layer 130 and the second conductor layer 120 (i.e., a short remains intact at the interface 126).

Figure 3:
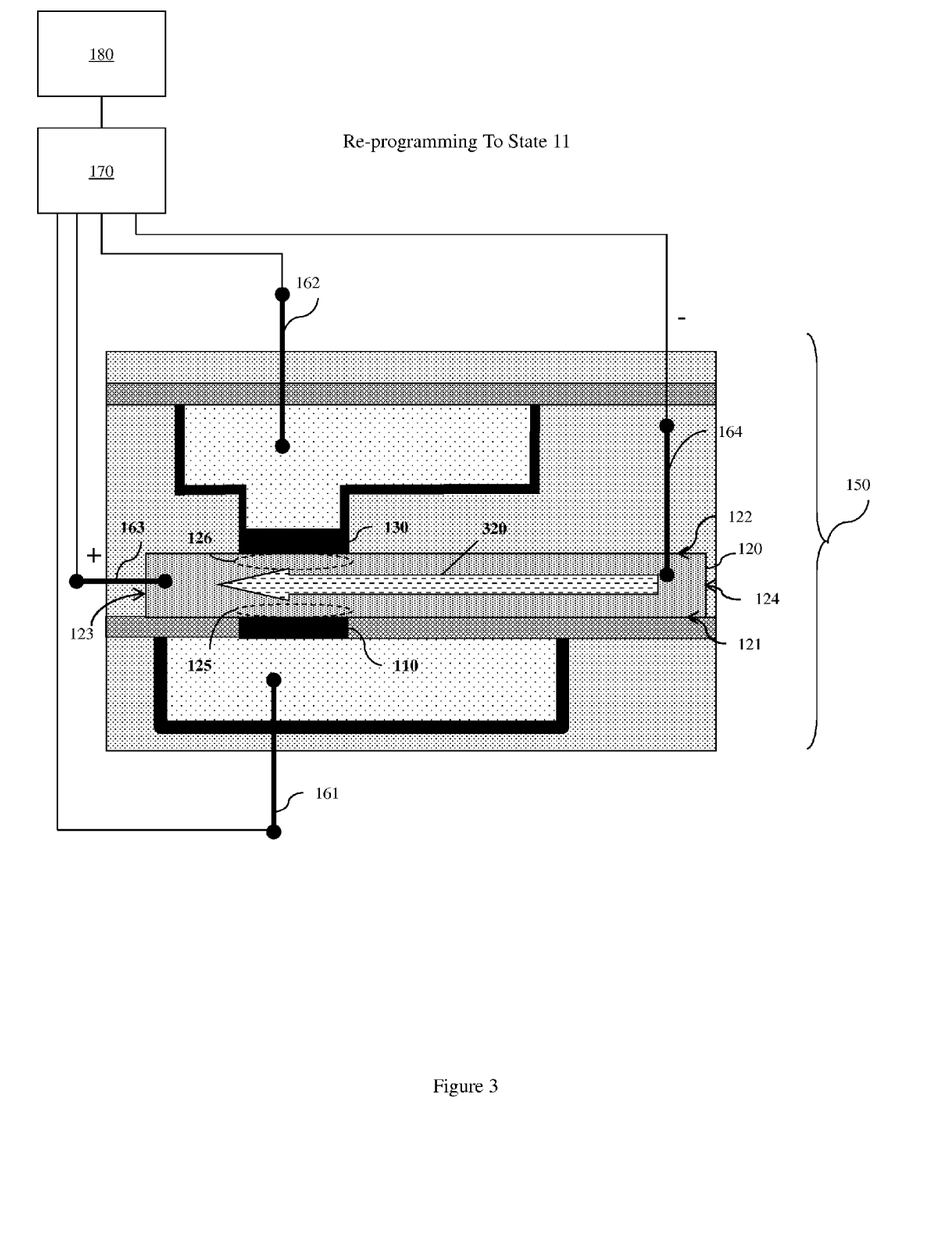
FIG. 3 is a schematic diagram illustrating of the embodiment of the e-fuse programming and re-programming circuit of FIG. 1 illustrating the e-fuse in a 11 reprogramming state.

As illustrated in FIG. 3, to reverse this 01 state, another control signal can cause the voltage source 170 to apply a negative voltage to the distal end 124 of the second conductor layer 120 (i.e., to the fourth terminal 164) and a positive voltage to the proximate end 123 of the second conductor layer 120 (i.e., to the third terminal 163). This will cause electrons within the second conductor layer to flow 320 back towards the proximate end 123 of the second conductor layer 120 (i.e., towards the third terminal 163) and, thereby cause atomic diffusion of the conductive material that comprises the second conducive layer 120, filling in the void 201 with second conductor material to recreate a short at the interface 125 with the first conductor layer 110 (i.e., re-connect terminal 161 to the other terminals 162-163).

The e-fuse 150 can similarly be programmed from the initial 11 state to a 10 state and re-programmed back to the 11 state on demand. Specifically, referring to FIG. 4, a control signal can cause the voltage source 170 to apply a negative voltage to the third conductor layer 130 (i.e., to the second terminal 162) and a positive voltage to the distal end 124 of the second conductor layer 120 (i.e., to the fourth terminal 164). This will cause electrons within the second conductor layer 120 to flow 420 from the interface 126 between the third conductor layer 130 and the second conductor layer 120 towards the distal end 124 of the second conductor layer 120 (i.e., towards the fourth terminal 164). Electrons flowing in this direction will cause atomic diffusion of the second conductor material (i.e., the conductive material that makes up the second conductor layer 120) away from the interface 126, thus creating an open 403 (i.e., a void). This open 403 effectively disconnects the terminal 162 from the other terminals 161, 163, 164. Electrons do not flow across the interface 125. Consequently, second conductor material remains at the interface 125 between the first conductor layer 110 and the second conductor layer 120 (i.e., a short remains intact at the interface 125).

As illustrated in FIG. 3, to reverse this 10 state, another control signal can cause the voltage source 170 to apply a negative voltage to the distal end 124 of the second conductor layer 120 (i.e., to the fourth terminal 164) and a positive voltage to the proximate end 123 of the second conductor layer 120 (i.e., to the third terminal 163). This will cause electrons within the second conductor layer 120 to flow 320 back towards the proximate end 123 of the second conductor layer 120 (i.e., towards the third terminal 163) and, thereby cause atomic diffusion of the second conductor material, filling in the void 403 with second conductor material and again create a short at the interface 126 with the third conductor layer 130 (i.e., re-connect terminal 162 to terminals 161 and 163-164).

Finally, the e-fuse 150 can similarly be programmed from the initial 11 state to a 00 state and re-programmed back to the 11 state on demand. Specifically, referring to FIG. 5, a control signal can cause the voltage source 170 to apply a negative voltage to the first conductor layer 110 (i.e., to the first terminal 161) and to the third conductor layer 130 (i.e., to the second terminal 162) and a positive voltage to a distal end 124 of the second conductor layer 120 (i.e., to the fourth terminal 164). This will cause electrons within the second conductor layer 120 to flow 520 from the interfaces 125 and 126 between the second conductor layer 120 and both the first and third conductor layers 110, 130 (i.e., from the first and second terminals 161, 162) towards the distal end 124 of the second conductor layer 120 (i.e., towards the fourth terminal 164). Electrons flowing in this manner will cause atomic diffusion of the second conductor material (i.e., the conductive material that makes up the second conductor layer 120) at both the interfaces 125 and 126, thus creating opens 501, 503 (i.e., voids). These opens 501, 503 effectively disconnect each of the terminals 161 and 162 from the other terminals 163 and 164.

As illustrated in FIG. 3, to reverse this 00 state, another control signal can cause the voltage source 170 to apply a negative voltage to the distal end 124 of the second conductor layer 120 (i.e., to the fourth terminal 164) and a positive voltage to the proximate end 123 of the second conductor layer 120 (i.e., to the third terminal 163) so as to fill in the opens 501, 503 and again create shorts at these interfaces 125, 126 (i.e., to re-connect the terminals 161 and 162).

It should be noted that during these programming and re-programming processes the magnitude of the voltage at the different terminals can also be adjusted in order to enhance the programming and/or re-programming processes.

Referring again to FIG. 1, it should further be noted that in the e-fuse 150, the distance 191 from either of the interfaces 125, 126 at the proximate end 123 of the second conductor layer 120 to the electrical connection 164 at the distal end 124 of the second conductor layer 120 must be a predetermined distance sufficient to allow for void formation at the interfaces 125, 126. Specifically, this length 191 should be greater than the critical voiding length, which is determined based on the atomic diffusion characteristics of the second conductor material (i.e., the conductive material that makes up the second conductor layer 120) and also the sizes of second and third conductor layers (or, more particularly, the sizes of the interfaces). The sizes (e.g., lengths and widths) of the second and third conductor layers can be any sizes achievable by the technology node used to manufacture the e-fuse. For illustration purposes the interfaces 125 and 126 are shown aligned; however, it is anticipated that the interfaces 125 and 126 may be offset in either the X or Z direction.

Figure 6:
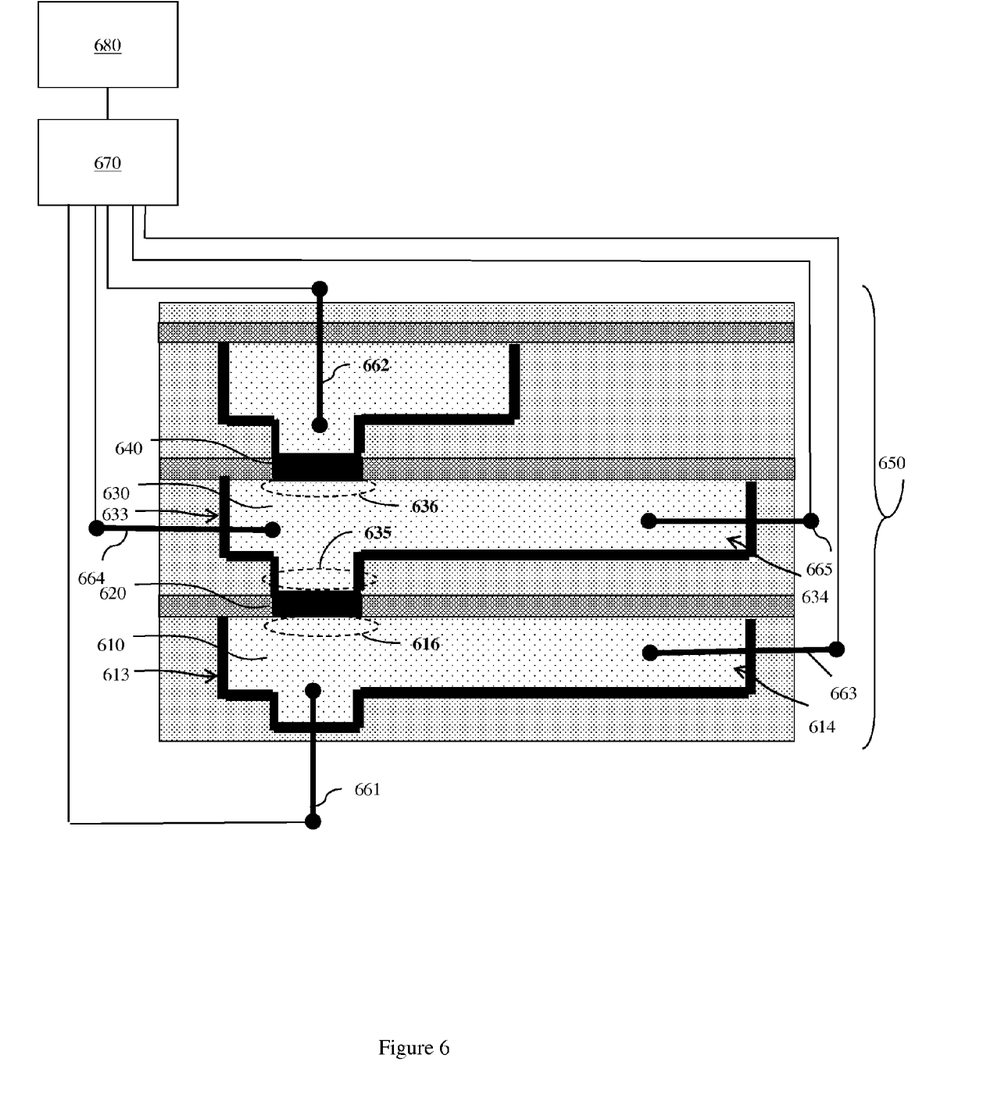
FIG. 6 is a schematic diagram of another embodiment of an e-fuse programming and re-programming circuit.

Referring to FIG. 6, another embodiment of the circuit structure can comprise an e-fuse 650, a selectively controllable voltage source 670 and electrical connections 661-665 between the e-fuse 650 and the voltage source 670.

The e-fuse 650 can comprise additional conductive layers allowing for more high atomic diffusion resistance-low atomic diffusion resistance interfaces, more terminals and, thereby more programming states. For example, the e-fuse 650 can comprise a first conductor layer 610, a second conductor layer 620 above the first conductor layer 610, a third conductor layer 630 above the second conductor layer 620, and a fourth conductor layer 640 above the third conductor layer 630. In this embodiment, the second and fourth conductor layers 620, 640 can be short relative to the first and third conductor layers 610, 630. The second and fourth conductor layers 620, 640 can further be positioned at the proximate ends 613, 633 of the first and third conductor layers 610, 630. Additionally, in this embodiment, the second conductor layer 620 and the fourth conductor layer 640 can each have a relatively high atomic diffusion resistance as compared to the first conductor layer 610 and the third conductor layer 630.

Specifically, the first conductor layer 610 and the third conductor layer 630 can comprise any suitable conductive material that exhibits low atomic diffusion resistance (i.e., exhibits high diffusivity). For example, the first and third conductor layers 610, 630 can comprise copper or aluminum. It should be noted that the first and third conductor layers 610, 630 can comprise either the same or different materials. Contrarily, the second and fourth conductor layers 620, 640 can comprise any suitable conductive material that exhibits high atomic diffusion resistance (i.e., a conductive diffusion barrier material that exhibits low diffusivity). For example, the second and fourth conductor layers 620, 640 can comprise cobalt, chromium, ruthenium, tantalum, tantalum nitride, indium oxide, tungsten, tungsten nitride, titanium and titanium nitride or any suitable allow thereof. It should be noted that the second and fourth conductor layers 620, 640 can comprise either the same conductive diffusion barrier materials or different conductive diffusion barrier materials.

The electrical connections 661-665 between the voltage source 670 and various locations on the e-fuse 650 create terminals. These electrical connections include electrical connections 661 and 663 between the voltage source 670 and opposite ends 613, 614 (i.e., the proximate and distal ends) of the first conductor layer 610, electrical connections 664, 665 between the voltage source 670 and opposite ends 633, 634 (i.e., the proximate and distal ends) of the third conductor layer 630 and an electrical connection 662 between the voltage source 670 and the fourth conductor layer 640. Thus, in this embodiment, the e-fuse 650 can have five distinct terminals.

The voltage source 670 is selectively controllable (i.e., is adapted to be selectively controlled, configured to be selectively controlled, for example, by a control signal from controller 680) so as to allow the polarity of the voltage and, optionally, the magnitude of the voltage at the electrical connections 661-665 (i.e., at the five terminals) to be varied. That is, the voltage source 670 can comprise a conventional voltage polarity switching circuit. Those skilled in the art will recognize that voltage polarity switching circuits are well-known; therefore, the specific details of such switching circuits are omitted to allow the reader to focus on the salient aspects of the embodiments described herein.

By selectively varying voltage polarity and, optionally, magnitude at the terminals 661-665, bi-directional flow of electrons within the first and third conductor layers 610 and 630 can be selectively controlled. By selectively controlling bi-directional flow of electrons within the first and third conductor layers 610, 630, the formation of non-destructive opens and/or shorts within the first and third conductor layers 610, 630 at the high atomic diffusion resistance-low atomic diffusion resistance interfaces 616, 635, 636 (i.e., within the first conductor layer 610 at the interface 616 with the second conductor layer 620 and within the third conductor layer 630 at the interfaces 635, 636 with the second conductor layer 620 and the fourth conductor layer 640, respectively) can be selectively controlled. As with the previous embodiment, by selectively controlling formation of such opens and/or shorts, the e-fuse 650 can be programmed and re-programmed with any one of multiple different states.

Figure 7:
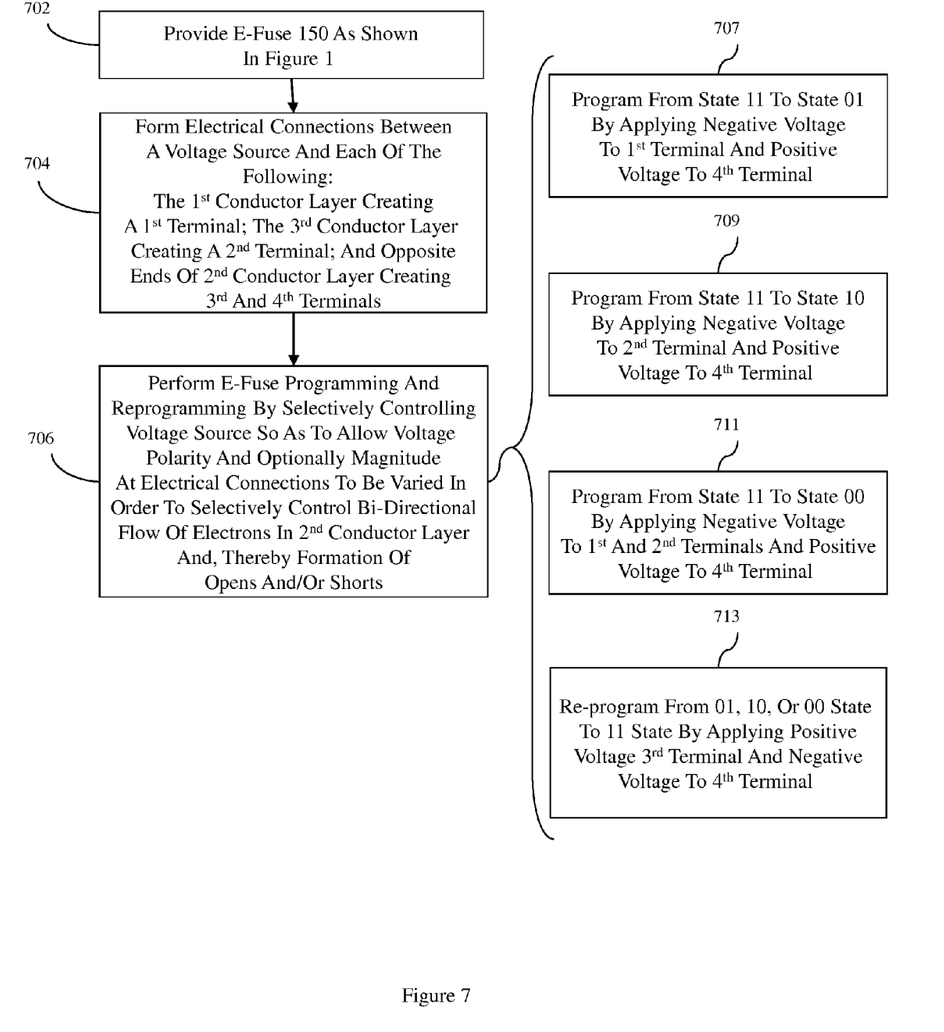
FIG. 7 is a flow diagram illustrating an embodiment of an e-fuse programming and re-programming method.
Figure 8:
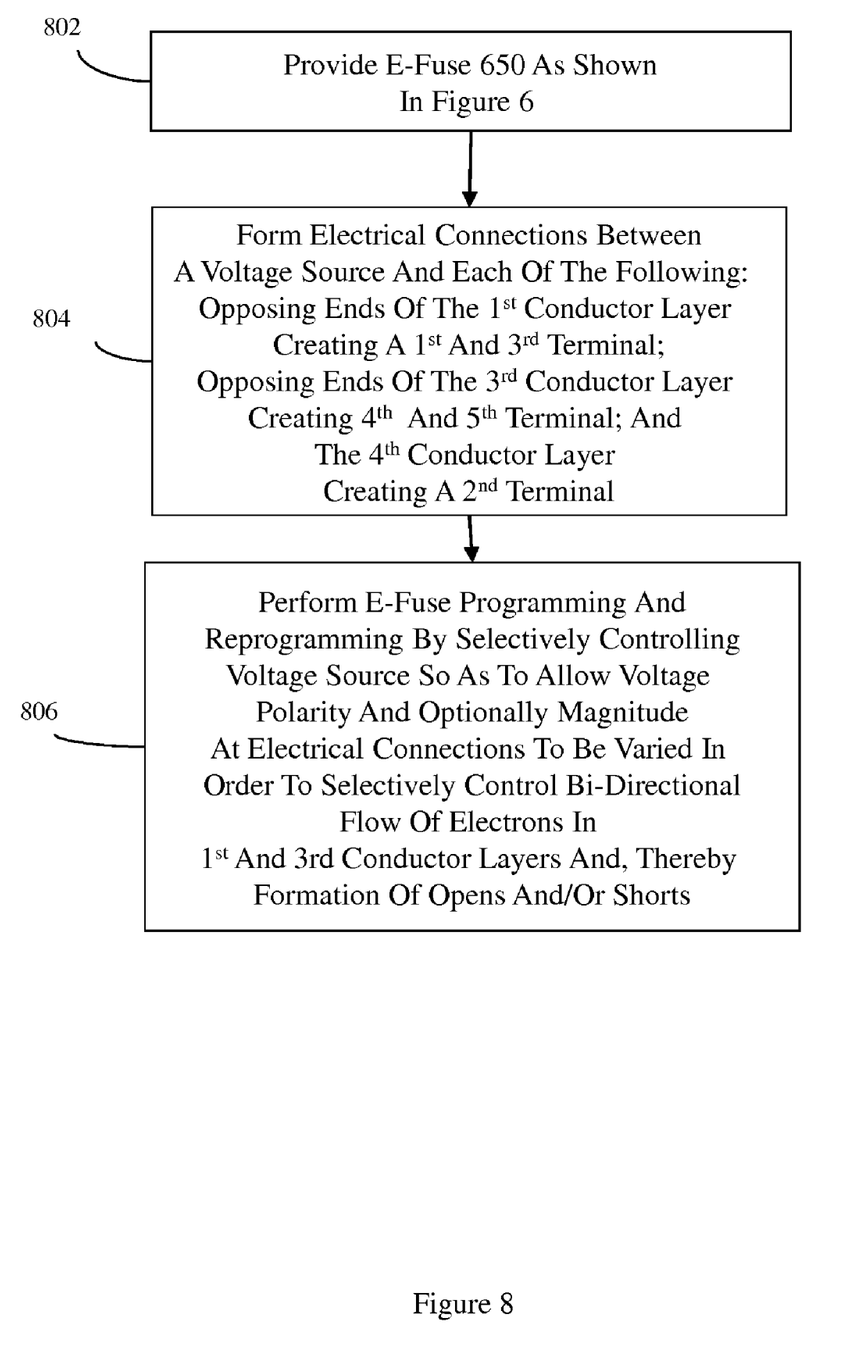
FIG. 8 is a flow diagram illustrating another embodiment of an e-fuse programming and re-programming method.

Referring to FIGS. 7 and 8, also disclosed herein are embodiments of an associated e-fuse programming and re-programming method. Embodiments of the method can comprise providing an e-fuse, electrically connecting a voltage source to different locations on the e-fuse and performing e-fuse programming and re-programming processes by selectively controlling the voltage source so as to selectively vary the polarity and, optionally, the magnitude of the voltage at the different locations.

Specifically, referring to FIG. 7, one method embodiment can comprise providing an e-fuse 150 such as that illustrated in FIG. 1 and described in detail above with regard to the first circuit structure embodiment (702). It should be noted that e-fuse 150 and, more specifically, the different conductor layers 110, 120, 130 that make up the e-fuse 150 can be formed on a semiconductor wafer during conventional back end of the line (BEOL) processing (i.e., during the formation of the metallization layers) using well-known subtractive etching, damascene, and dual-damascene techniques, the specific details of which are omitted to allow the reader to focus on the salient aspects of the embodiments described herein.

Electrical connections 161-164 are then formed between a voltage source 170 and the first conductor layer 110 creating a first terminal, between the voltage source and the third conductor layer 130 creating a second terminal and between the voltage source 170 and opposite ends (i.e., a proximate end 123 and a distal end 124) of the second conductor layer 120 creating third and fourth terminals, respectively, such that the e-fuse has four distinct terminals (704).

Next, e-fuse programming and reprogramming processes can be performed by selectively controlling the voltage source 170 (e.g., via a control signal from a controller 180) so as to allow voltage polarity and, optionally, magnitude at the four terminals to be varied in order to selectively control bi-directional flow of electrons within the second conductor layer 120 (706). The bi-directional flow of electrons within the second conductor layer 120 can be selectively controlled in order to selectively form non-destructive opens and/or shorts within the second conductor layer 120 at the high atomic diffusion resistance-low atomic diffusion resistance interfaces 125, 126 (i.e., at the interfaces 125, 126 between the second conductor layer 120 and the first and third conductor layers 110, 130) and, thereby to program or re-program the e-fuse 150 with any one of four different programming states. These states are referred to hereinafter as: 11, 01, 10, and 00, with state 11 comprising an initial state (i.e., a baseline state) without any opens such that all terminals are electrically connected (i.e., such that there are shorts at the interfaces 125, 126 between the second conductor layer 120 and both the first conductor layer 110 and the third conductor layer 130) and with states 01, 10, and 00 comprising programmed states with one or more opens at the interfaces 125, 126 between the second conductor layer 120 and the first and third conductor layers 110, 130.

For example, the e-fuse 150 can be programmed from the initial 11 state to a 01 state and re-programmed back to the 11 state on demand. Specifically, a first programming process can be performed by applying a negative voltage to the first conductor layer 110 (i.e., to the first terminal 161) and a positive voltage to the distal end 124 of the second conductor layer 120 (i.e., to the fourth terminal 164) (707, see FIG. 2). This will cause electrons within the second conductor layer 120 to flow 220 from the interface 125 between the first conductor layer 110 and the second conductor layer 120 towards the distal end 124 of the second conductor layer 120 (i.e., towards the fourth terminal 164). Electrons flowing in this direction will cause atomic diffusion of the second conductor material (i.e., the conductive material that makes up the second conductor layer 120) at the interface 125, thus creating an open 201 (i.e., a void). This open 201 effectively disconnects the terminal 161 from the other terminals 162-164. Electrons do not flow across the interface 126. Consequently, second conductor material remains at the interface 126 between the third conductor layer 130 and the second conductor layer 120 (i.e., a short remains intact at the interface 126). To reverse this 01 state, a second programming process can be performed by applying a negative voltage to the distal end 124 of the second conductor layer 120 (i.e., to the fourth terminal 164) and a positive voltage to the proximate end 123 of the second conductor layer 120 (i.e., to the third terminal 163) (713, see FIG. 3). This will cause electrons within the second conductor layer 120 to flow 320 back towards the proximate end 123 of the second conductor layer 120 (i.e., towards the third terminal 163) and, thereby cause atomic diffusion of the second conductor material, filling in the open 201 and re-creating a short at the interface 125 with the first conductor layer 110 (i.e., re-connecting terminal 161 to the other terminals 162-163).

The e-fuse 150 can similarly be programmed from the initial 11 state to a 10 state and re-programmed back to the 11 state on demand. Specifically, a first programming process can be performed by applying a negative voltage to the third conductor layer 130 (i.e., to the second terminal 162) and a positive voltage to the distal end 124 of the second conductor layer 120 (i.e., to the fourth terminal 164) (709, see FIG. 4). This will cause electrons within the second conductor layer 120 to flow from the interface 126 between the third conductor layer 130 and the second conductor layer 120 towards the distal end 124 of the second conductor layer 120 (i.e., towards the fourth terminal 164). Electrons flowing in this direction will cause atomic diffusion of the second conductor material (i.e., the conductive material making up the second conductor layer 120) at the interfaces 126, thus creating an open 403 (i.e., a void). This open 403 effectively disconnects the terminal 162 from the other terminals 161 and 163-164. Electrons do not flow across the interface 125. Consequently, second conductor material remains at the interface 125 between the first conductor layer 110 and the second conductor layer 120 (i.e., a short remains intact at the interface 125). To reverse this 10 state, a second programming process can be performed by applying a negative voltage to the distal end 124 of the second conductor layer 120 (i.e., to the fourth terminal 164) and a positive voltage to the proximate end 123 of the second conductor layer 120 (i.e., to the third terminal 163) (713, see FIG. 3). This will cause electrons within the second conductor layer 120 to flow 320 back towards the proximate end 123 of the second conductor layer 120 (i.e., towards the third terminal 163) and, thereby cause atomic diffusion of the second conductor material, filling in the open 403 and re-creating a short at the interface 126 with the third conductor layer 130 (i.e., re-connecting terminal 162 to terminals 161 and 163-164).

Finally, the e-fuse 150 can similarly be programmed from the initial 11 state to a 00 state and re-programmed back to the 11 state on demand. Specifically, a first programming process can be performed by applying a negative voltage to the first conductor layer 110 (i.e., to the first terminal 161) and to the third conductor layer 130 (i.e., to the second terminal 162) and a positive voltage to a distal end 124 of the second conductor layer 120 (i.e., to the fourth terminal 164) (711, see FIG. 5). This will cause electrons within the second conductor layer 120 to flow 520 from the interfaces 125, 126 between the second conductor layer 120 and both the first and third conductor layers 110, 130 (i.e., from the first and second terminals 161, 162) towards the distal end 124 of the second conductor layer 120 (i.e., towards the fourth terminal 164). Electrons flowing in this manner will cause atomic diffusion of the second conductor material (i.e., the conductive material making upon the second conductor layer 120) away from the interfaces 125, 126, thus creating opens 501, 503 (i.e., voids). These opens 501, 503 effectively disconnect each of the terminals 161 and 162 from the other terminals. To reverse this 00 state, a second programming process can be performed by applying a negative voltage to the distal end 124 of the second conductor layer 120 (i.e., to the fourth terminal 164) and a positive voltage to the proximate end 123 of the second conductor layer 120 (i.e., to the third terminal 163) so as to fill in the opens 501, 503 and re-create shorts at these interfaces 125, 126 (i.e., re-connect terminals 161 and 162).

Another embodiment of the method can comprise providing an e-fuse having additional conductive layers so as to allow for more high atomic diffusion resistance-low atomic diffusion resistance interfaces, more terminals and, thereby more programming states. Specifically, referring to FIG. 8, another embodiment of the method can comprise providing an e-fuse 650 such as that illustrated in FIG. 6 and described in detail above with regard to the first circuit structure embodiment (802). It should be noted that e-fuse 650 and, more specifically, the different conductor layers 610, 620, 630, and 640 that make up the e-fuse 650 can be formed on a semiconductor wafer during conventional back end of the line (BEOL) processing (i.e., during the formation of the metal-lization layers) using well-known subtractive etching, damascene, and dual-damascene techniques, the specific details of which are omitted to allow the reader to focus on the salient aspects of the embodiments described herein.

Electrical connections 661-665 can then be formed between a voltage source 670 and opposite ends 613, 614 of the first conductor layer 610 (i.e., proximate 613 and distal 614 ends of the first conductor layer 610 creating first and third terminals, respectively, between the voltage source and the fourth conductor layer 640 creating a second terminal and between the voltage source 670 and opposite ends 633, 634 of the third conductor layer 630(i.e., proximate 633 and distal 634 ends of the third conductor layer 630 creating fourth and fifth terminals (804). Thus, in this embodiment, the e-fuse can have five distinct terminals.

Next, e-fuse programming and reprogramming processes can be performed by selectively controlling the voltage source 670 (e.g., via a control signal from a controller 680) so as to allow voltage polarity at the electrical connections 661-665 (i.e., at the five terminals) to be varied in order to selectively control bi-directional flow of electrons within the first and third conductor layers (806). The bi-directional flow of electrons within the first and third conductor layers 610, 630 can be selectively controlled in order to form non-destructive opens and/or shorts within the first and third conductor layers 610, 630 at the high atomic diffusion resistance-low atomic diffusion resistance interfaces 616, 635, 636 (i.e., within the first conductor layer 610 at the interface 616 with the second conductor layer 620 and within the third conductor layer 630 at the interfaces 635, 636 with the second conductor layer 620 and the fourth conductor layer 640, respectively). As with the previous method embodiment, by selectively controlling formation of such opens and/or shorts, the e-fuse 650 can be programmed and re-programmed with any one of multiple different states.

It should be understood that the phrase "proximate end" as used herein with respect to any conductor layers (e.g., the second conductor layer 120 of FIG. 1 or the first and third conductor layers 610 and 630 of FIG. 6) refers to that end closest to one or more interfaces with other conductor layers, whereas the use of the phrase "distal end" as used herein with respect to any conductor layers refers to that end farthest from such interfaces. It should further be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments a circuit structure for programming and re-programming a low power, multiple states, electronic fuse (i.e., an e-fuse). In one embodiment of the circuit, the e-fuse can comprise two relatively short conductor layers positioned on opposite sides and at a same end of a relatively long conductor layer. The short conductor layers can have a relatively high atomic diffusion resistance (i.e., can exhibit low atomic diffusivity) and the long conductor layer can have a relatively low atomic diffusion resistance (i.e., can exhibit high atomic diffusivity). A voltage source can be electrically connected to opposing ends of the long conductor layer and also to each of the short conductor layers such that the e-fuse structure has four terminals. The voltage source can be selectively controlled in order to vary the polarity and, optionally, the magnitude of the voltage applied to the different terminals. By varying voltage polarity (and magnitude) at the different terminals, bi-directional flow of electrons within the long conductor layer can be selectively controlled. By controlling bi-directional flow of electrons within the long conductor layer, formation of non-destructive opens and/or shorts at the long conductor layer-short conductor layer interfaces can be selectively controlled to achieve multiple different programming states. Other embodiments of the circuit can incorporate an e-fuse with additional conductor layers and additional terminals so as to allow for even more programming states. Also disclosed are embodiments of associated e-fuse programming and re-programming methods. The above-described embodiments allow for low power non-destructive programming and re-programming and have the advantage of being fully compatible with existing back end of the line (BEOL) metallization processes.

What is claimed is:

1. A circuit structure comprising:
a fuse comprising:
a first conductor layer;
a second conductor layer on said first conductor layer; and
a third conductor layer on said second conductor layer, said first conductor layer and said third conductor layer each having a relatively high atomic diffusion resistance as compared to said second conductor layer;
a voltage source; and
electrical connections between said voltage source and said first conductor layer, between said voltage source and opposite ends of said second conductor layer, and between said voltage source and said third conductor layer, said voltage source being selectively controllable so as to allow voltage polarity at selected ones of said electrical connections to be varied in order to selectively control bi-directional flow of electrons within said second conductor layer and, thereby to selectively control formation of any of non-destructive opens and shorts within said second conductor layer at interfaces with said first conductor layer and said third conductor layer.

2. The circuit structure of claim 1, said opposite ends of said second conductor layer comprising a proximate end and a distal end opposite said proximate end, said first conductor layer and said third conductor layer each being short relative to said second conductor layer and further being positioned on opposite sides of and adjacent to said proximate end of said second conductor layer.

3. The circuit structure of claim 1, said voltage source further being selectively controllable so as to allow voltage magnitude at selected ones of said electrical connections to be varied.

4. The circuit structure of claim 2,
said voltage source applying a negative voltage to said third conductor layer and a positive voltage to said distal end of said second conductor layer so as to create an open at said interface with said third conductor layer; and
said voltage source further applying a negative voltage to said distal end of said second conductor layer and a positive voltage to said proximate end of said second conductor layer so as to fill in said open, re-creating a short at said interface with said third conductor layer.

5. The circuit structure of claim 2,
said voltage source applying a negative voltage to said first conductor layer and a positive voltage to said distal end of said second conductor layer so as to create an open at said interface with said first conductor layer; and
said voltage source further applying a negative voltage to said distal end of said second conductor layer and a positive voltage to said proximate end of said second conductor layer so as to fill in said open, re-creating a short at said interface with said first conductor layer.

6. The circuit structure of claim 2,
said voltage source applying a negative voltage to said first conductor layer and said third conductor layer and a positive voltage to said distal end of said second conductor layer so as to create opens at said interfaces;
said voltage source further applying a negative voltage to said distal end of said second conductor layer and a positive voltage to said proximate end of said second conductor layer so as to fill in said opens, re-creating shorts at said interfaces.

7. The circuit structure of claim 1, said second conductor layer comprising any of copper and aluminum.

8. The circuit structure of claim 1, said first conductor layer and said third conductor layer each comprising a conductive diffusion barrier material.

9. The circuit structure of claim 8, said conductive diffusion barrier material comprising any of cobalt, chromium, ruthenium, tantalum, tantalum nitride, indium oxide, tungsten, tungsten nitride, titanium and titanium nitride.

10. A circuit structure comprising:
a fuse comprising:
a first conductor layer;
a second conductor layer above said first conductor layer;
a third conductor layer above said second conductor layer; and
a fourth conductor layer above said third conductor layer, said second conductor layer and said fourth conductor layer each having a relatively high atomic diffusion resistance as compared to said first conductor layer and said third conductor layer;
a voltage source; and
electrical connections between said voltage source and opposite ends of said first conductor layer, between said voltage source and opposite ends of said third conductor layer, and between said voltage source and said fourth conductor layer, said voltage source being selectively controllable so as to allow voltage polarity at said electrical connections to be varied in order to selectively control bi-directional flow of electrons within said first conductor layer and said third conductor layer and, thereby to selectively control formation of any of non-destructive opens and shorts within said first conductor layer at an interface with said second conductor layer and within said third conductor layer at interfaces with said second conductor layer and said fourth conductor layer.

11. The circuit structure of claim 10, said second conductor layer and said fourth conductor layer each being short relative to said first conductor layer and said third conductor layer.

12. The circuit structure of claim 10, said voltage source further being selectively controllable so as to allow voltage magnitude at selected ones of said electrical connections to be varied.

13. The circuit structure of claim 10, said first conductor layer and said third conductor layer each comprising any of copper and aluminum.

14. The circuit structure of claim 10, said second conductor layer and said fourth conductor layer each comprising a conductive diffusion barrier material.

15. The circuit structure of claim 14, said conductive diffusion barrier material comprising any of cobalt, chromium, ruthenium, tantalum, tantalum nitride, indium oxide, tungsten, tungsten nitride, titanium and titanium nitride.

16. A fuse programming and re-programming method comprising:

provinding a fuse comprising a first conductor layer, a second conductor layer on said first conductor layer, and a third conductor layer on said second conductor layer, wherein said first conductor layer and said third conductor layer each have a relatively high atomic diffusion resistance as compared to said second conductor layer, wherein said second conductor layer has a proximate end and a distal end opposite said proximate end, and wherein said first conductor layer and said third conductor layer are short relative to said second conductor layer and are positioned on opposite sides of said proximate end and are positioned adjacent to said proximate end of said second conductor layer;

forming electrical connections between a voltage source and said first conductor layer, between said voltage source and opposite ends of said second conductor layer, and between said voltage source and said third conductor layer; and performing programming and reprogramming processes by selectively controlling said voltage source so as to allow voltage polarity at said electrical connections to be varied in order to selectively control bi-directional flow of electrons within said second conductor layer and, thereby to selectively control formation of any of non-destructive opens and shorts within said second conductor layer at interfaces with said first conductor layer and said third conductor layer.

17. The method of claim 16, said performing of said programming and reprogramming processes further comprising:

performing a first programming process by applying a negative voltage to said third conductor layer and a positive voltage to said distal end of said second conductor layer so as to create an open at said interface with said third conductor layer; and performing a second programming process by applying a positive voltage to said proximate end of said second conductor layer and a negative voltage to said distal end of said second conductor layer so as to fill in said open, creating a short at said interface with said third conductor layer.

18. The method of claim 16, said performing of said programming and reprogramming processes further comprising:

performing a first programming process by applying a negative voltage to said first conductor layer and a positive voltage to said distal end of said second conductor layer so as to create an open at said interface with said first conductor layer; and performing a second programming process by applying a negative voltage to said distal end of said second conductor layer and a positive voltage to said proximate end of said second conductor layer so as to fill in said open, creating a short at said interface with said first conductor layer.

19. The method of claim 16, said performing of said programming and said reprogramming processes further comprising:

performing a first programming process by applying a negative voltage to said first conductor layer and said third conductor layer and a positive voltage to said distal end of said second conductor layer so as to create said opens at said interfaces;

performing a second programming process by applying a negative voltage to said distal end of said second conductor layer and a positive voltage to said proximate end of said second conductor layer so as to fill in said opens, creating said shorts at said interfaces.

20. A fuse programming and re-programming method comprising:

providing a fuse comprising a first conductor layer, a second conductor layer above said first conductor layer, a third conductor layer above said second conductor layer, and a fourth conductor layer above said third conductor layer, said second conductor layer and said fourth conductor layer each having a relatively high atomic diffusion resistance as compared to said first conductor layer and said third conductor layer;

forming electrical connections between a voltage source and opposite ends of said first conductor layer, between said voltage source and opposite ends of said third conductor layer, and between said voltage source and said fourth conductor layer; and performing programming and reprogramming processes by selectively controlling said voltage source so as to allow voltage polarity at said electrical connections to be varied in order to selectively control bi-directional flow of electrons within said first conductor layer and said third conductor layer and, thereby to selectively control formation of any of non-destructive opens and shorts within said first conductor layer at an interface with said second conductor layer and within said third conductor layer at interfaces with said second conductor layer and said fourth conductor layer.

* * * * *